United States Patent [19]
Gupta et al.

[11] Patent Number: 6,034,887
[45] Date of Patent: Mar. 7, 2000

[54] NON-VOLATILE MAGNETIC MEMORY CELL AND DEVICES

[75] Inventors: Arunava Gupta, Valley Cottage; Rajiv V. Joshi, Yorktown Heights, both of N.Y.

[73] Assignee: International Business Machines Corporation, Armonk, N.Y.

[21] Appl. No.: 09/129,827

[22] Filed: Aug. 5, 1998

[51] Int. Cl.[7] .................................................. G11C 13/00
[52] U.S. Cl. ........................................... 365/171; 365/173
[58] Field of Search .................................... 365/171, 173, 365/51, 63, 185.08, 149, 150, 15 A, 157, 158

[56] References Cited

U.S. PATENT DOCUMENTS

| | | | |
|---|---|---|---|
| 5,331,591 | 7/1994 | Clifton | 365/182 |
| 5,343,422 | 8/1994 | Kung et al. | 365/173 |
| 5,370,301 | 12/1994 | Belcher et al. | 228/180.22 |
| 5,629,922 | 5/1997 | Moodera et al. | 369/126 |
| 5,640,343 | 6/1997 | Gallagher et al. | 365/171 |
| 5,650,958 | 7/1997 | Gallagher et al. | 365/173 |
| 5,748,519 | 5/1998 | Tehrani et al. | 365/171 |
| 5,774,394 | 6/1998 | Chen et al. | 365/173 |

OTHER PUBLICATIONS

Spin–Valve Ram Cell, Tang et al., IEEE Transactions on Magnetics, vol. 31, No. 6, Nov. 1995.
Large Magnetoresistance at Room Temperature in Ferromagnetic Thin Film Tunnel Functions, Moodera et Al., Physical Review Letter, vol. 74, No. 16, Apr. 1995.

*Primary Examiner*—Tan T. Nguyen
*Attorney, Agent, or Firm*—F. Chau & Associates, LLP

[57] ABSTRACT

A magnetic tunneling junction cell for use in memory and logic switching applications is formed with a first ferromagnetic layer, a second ferromagnetic layer, and an insulating layer interposed between said first and second ferromagnetic layers to form a magnetic tunnel junction element. The cell further includes a write conductor which has a first conductor segment aligned in a first direction and located proximate to the first ferromagnetic layer and a second conductor segment aligned in a second direction, substantially orthogonal to the first direction and located proximate to the second ferromagnetic layer. The write conductor is terminated by a capacitive structure which allows a bidirectional current to be established in the write conductor using a monopolar write voltage and only a single port write terminal. The bidirectional current writes a high impedance state into the cell in a first current direction and a low impedance state into the cell in a second current direction. Preferably, the first and second ferromagnetic layers are formed with a half-metallic ferromagnetic material which features near total spin polarization, resulting in a cell having near ideal switching characteristics. Such a cell is suitable for switching devices, logic devices and non-volatile memory devices.

43 Claims, 9 Drawing Sheets

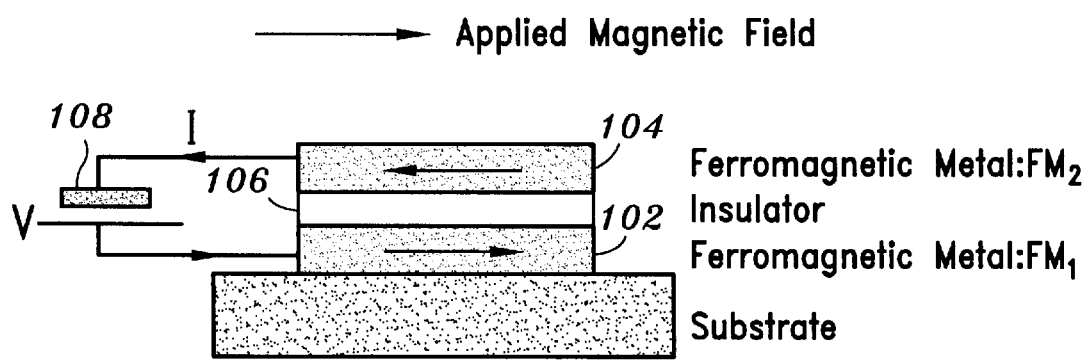
FIG. 1-PRIOR ART

"OPEN" STATE – $R_{AB}$ High

"CLOSED" STATE – $R_{AB}$ Low

NON-VOLATILE MAGNETIC MEMORY CELL AND DEVICES

BACKGROUND OF THE INVENTION

1. Field of the Invention

The present invention generally relates magnetic storage devices and more particularly relates to non-volatile magnetic memory cells as well as memory and logic switching devices employing the memory cells.

2. Description of the Related Art

The desired characteristics of a memory cell for computer memory are high speed, low power, non-volatility and low cost. Low cost is generally accomplished by use of simple fabrication processes and high cell density. Dynamic random access memory (DRAM) cells are fast and expend little power. However, the contents of DRAM cells are volatile and consequently have to be refreshed many times each second. Flash type EEPROM cells are non-volatile, have low sensing power, and are constructed as a single device. However, EEPROM cells generally take microseconds to write data contents and milliseconds to erase such contents. This slow access time makes EEPROM cells undesirable for many applications, especially for use in computer main memory.

Unlike DRAM, magnetic memory cells which store information as the orientation of magnetization of a ferromagnetic region can hold stored information for long periods of time, and are therefore, non-volatile. Certain types of magnetic memory cells that use the magnetic state to alter the electrical resistance of the materials near the ferromagnetic region are collectively known as magneto resistive (MR) memory cells. An array of such MR memory cells is generally referred to as magnetic RAM or MRAM. MRAM devices were first proposed in the form of a bi-stable magnetic element employing MR sensing in U.S. Pat. No. 3,375,091. The cells of the MRAM were designed based on the anisotropic magneto resistance (AMR) effect of magnetic metals and alloys. The MRAM cell has two stable magnetic configurations with a "high" resistance representing a logic state 0 and "low" resistance representing a logic state one. However, the magnitude of the AMR effect is generally less than 5% in most ferromagnetic systems, which limits the magnitude of the sensing signal. This translates into very slow access times for such devices.

More sensitive and efficient prototype MRAM devices have recently been fabricated using spin-valve structures exhibiting giant magnetoresistance (GMR), as disclosed by Tang et al. in "Spin-Valve Ram Cell", IEEE Trans. Magn., Vol. 31, 3206 (1995). The basic storage element disclosed is a stripe which consists of a pair of magnetic layers separated by a thin copper spacer layer. The magnetization of one of the magnetic layers is pinned in a fixed magnetic orientation by exchange coupling to a thin anti-ferromagnetic layer, while the magnetization of the other layer is free. When the magnetization of the free layer is the same as that of the pinned layer, the resistance of the cell is lower then when the magnetization of the layers are opposite to one another. These two magnetic configurations represent the "0" and "1" logic states. Such devices exhibit resistance changes as high as 14%, which result in higher signal levels and faster access times than previous MRAM cells. However, upon reading the contents of the cell, the contents are destroyed. Moreover, the inherently low resistance of the spin-valve devices requires high sensing power, which make the production of high density memory devices prohibitive.

A magnetic tunnel junction (MTJ) is based on substantially different physical principles then AMR or GMR cells. In an MTJ, two magnetic layers are separated by an insulating tunnel barrier and the magnetoresistance results from the spin-polarized tunneling effect of conduction electrons between the two ferromagnetic layers. The tunneling current depends on the relative orientation of the magnetization of the two ferromagnetic layers. An MTJ is described by Moodera et al. in "Large Magnetoresistance at Room Temperature in Ferromagnetic Thin Film Tunnel Junctions", Phy. Rev. Lett., Vol. 74, No.16, Apr. 17, 1995, pp.3273–3276.

A schematic of an MTJ is shown in FIG. 1. The central component is a sandwich of three layers including two ferromagnetic metal layers (FM1 and FM2) separated by an insulator layer. The thickness of FM1 102 and FM2 104 can be any value in the range from a few atomic layers to a few microns. The thickness of the insulator layer 106 is in the range of 1–10 nanometers (nm). When a voltage 108 is applied across FM layers 102 and 104, electrons from one FM layer can tunnel through the insulating layer 106 and enter the other FM layer to give rise to an electrical current called tunneling current, $I_t$. The magnitude of the tunneling current $I_t$ depends on the magnitude of the voltage. The resistance of the MTJ is defined as $R=V/I_t$, which is also a function of the applied voltage. The magnitude of the resistance is also dependent upon the relationship of the magnetization of FM layer 102 and FM layer 104. When the magnetization of the layers are parallel to each other, R assumes a small value, $R_{min}$. When the magnetization of the layers are anti-parallel, the magnitude of R is at is its maximum, $R_{max}$. In the range between these extremes ($0<\Theta<180°$), the value of the resistance varies between the minimum and maximum values.

Generally, the magnetization of FM1 102 can be fixed in a certain direction (for example, by having a higher coercivity material or by pinning it by anti-ferromagnetic exchange, as in the case of spin-valves), while changing the magnetization direction of FM2 104 by an applied magnetic field to achieve the desired resistance.

While MTJ devices have several characteristics which make them desirable for use in memory applications, previous practical limitations have prevented successful commercialization of these products. Accordingly, improved MTJ cell construction and memory device architecture are required to facilitate successful use of MTJ cells in commercial applications.

SUMMARY OF THE INVENTION

In accordance with one form of the present invention, a magnetic tunneling junction cell for use in memory and logic switching applications is formed having a first ferromagnetic layer, a second ferromagnetic layer, and an insulating layer interposed between the first and second ferromagnetic layers to form a magnetic tunnel junction element. The cell also includes a write conductor which has a first conductor segment aligned in a first direction and placed proximate to the first ferromagnetic layer and a second conductor segment aligned in a second direction, substantially orthogonal to the first direction and placed proximate to the second ferromagnetic layer. The cell further includes a circuit element which terminates the first and second conductor segments and allows a bidirectional current to be established in the write conductor using a monopolar write voltage and only a single port write terminal. The bidirectional current writes a high impedance state into the cell in a first current direction and a low impedance state into the cell in a second current direction.

Preferably, the first and second ferromagnetic layers are formed with a half-metallic ferromagnetic material. Such materials include $CrO_2$, $Fe_3O_4$, manganites taking the form of $La_{1-x}D_xMnO_3$ where D is an alkaline earth element, and Heusler alloys of the form $X_2MnY$, where X is one of Co, Ni, Cu, and Pd and Y is one Al, Sn, In, and Sb. Half-metallic ferromagnetic materials feature near total spin polarization which results in a cell having near ideal switching characteristics.

The circuit element which enables bidirectional current flow can take the form of a capacitor structure which stores charge in a first direction and discharges current in a second direction. The circuit element can also take the form of a voltage divider circuit. In an alternate embodiment, where a bipolar write voltage is available, the circuit element can take the form of a resistive termination to a ground potential.

In accordance with another embodiment of the present invention, a magnetic random access memory (MRAM) device is formed which includes a plurality of bit lines and a plurality of word lines. The bit lines and word lines run in a substantially orthogonal fashion forming a plurality of intersection points. The MRAM further includes a plurality of magnetic tunnel junction cells, with a single cell being associated with each intersection point. The cells are formed with a first ferromagnetic layer, a second ferromagnetic layer, and an insulating layer interposed between the ferromagnetic layers. Each cell also includes a write conductor which has a first conductor segment aligned in a first direction and proximate to the first ferromagnetic layer and a second conductor segment aligned in a second direction, substantially orthogonal to the first direction, and proximate to the second ferromagnetic layer. The write conductor of each cell is terminated with a circuit element which enables bidirectional current flow, such as a capacitive structure. A first transistor couples the write conductor to a corresponding bit line and word line. A second transistor couples the corresponding word line to the first ferromagnetic layer for applying a read signal to the cell. Each cell has an associated sense amplifier which is interposed between the second ferromagnetic layer and a corresponding output bit line for detecting an applied read signal.

Preferably, the first and second ferromagnetic layers are formed with a half-metallic ferromagnetic material. Such materials include $CrO_2$, $Fe_3O_4$, manganites taking the form of $La_{1-x}D_xMnO_3$ where D is an alkaline earth element, and Heusler alloys of the form $X_2MnY$, where X is one of Co, Ni, Cu, and Pd and Y is one Al, Sn, In, and Sb. Half-metallic ferromagnetic materials feature near total spin polarization which results in a cell having near ideal switching characteristics. This results in an MRAM which is easily and quickly read.

In accordance with another embodiment of the present invention, a magnetic random access memory (MRAM) device is formed which includes a plurality of tri-state bit lines which are substantially parallel to one another and reside on a first plane. The MRAM also includes a plurality of tri-state word lines which are substantially parallel to one another and reside on a second plane. The word lines and bit lines are substantially orthogonal and establish an array of rows and columns having a plurality of intersection points. Each word line and bit line is terminated with a circuit element which enables bidirectional current flow, such as a capacitive structure. The MRAM includes a plurality of magnetic tunnel junction cells which correspond to the intersection points. The cells are interposed between the first plane and the second plane and are formed with a first ferromagnetic layer, a second ferromagnetic layer, and an insulating layer interposed between the ferromagnetic layers.

The MRAM further includes means for coupling each cell to a corresponding word line and bit line during a read cycle and electrically isolating the cell from the word line and bit line during a write cycle. The state of a cell is written by passing a current in the corresponding bit line and word line which establishes a magnetic field sufficient to polarize the cell. A cell is read by enabling the coupling means and providing a read signal to the cell.

Preferably, the first and second ferromagnetic layers are formed with a half-metallic ferromagnetic material. Such materials include $CrO_2$, $Fe_3O_4$, manganites taking the form of $La_{1-x}D_xMnO_3$ where D is an alkaline earth element, and Heusler alloys of the form $X_2MnY$, where X is one of Co, Ni, Cu, and Pd and Y is one Al, Sn, In, and Sb. Half-metallic ferromagnetic materials feature near total spin polarization which results in a cell having near ideal switching characteristics. This results in an MRAM which is easily and quickly read.

In accordance with another form of the present invention, magnetic logic devices are formed including first and second half-metallic magnetic tunneling junction cells each having an input terminal, an output terminal, and a first write conductor input terminal. The first half-metallic magnetic tunneling junction cells have an ON state and an OFF state which are set in response to a signal applied to the write conductor input terminal. The on state presents a low resistance between the input and output terminals and the off state presenting a high resistance between said input and output terminals. The write conductor input terminals of the first and second cells form logic input terminals, the input and output terminals are interconnected o implement various logic functions between a logic device output terminal the logic input terminals. Such logic functions include OR, NOR, AND, NAND and XOR logic functions.

In accordance with yet another embodiment of the present invention, a computer integrated circuit having non-volatile magnetic memory is formed which includes a first substrate on which a computer processor is formed and a second substrate on which an magnetic random access memory is formed. The first and second substrates are preferably joined using flip-chip integration technology, such that the computer processor is operatively coupled to the magnetic random access memory.

These and other objects, features and advantages of the present invention will become apparent from the following detailed description of illustrative embodiments thereof, which is to be read in connection with the accompanying drawings.

BRIEF DESCRIPTION OF THE DRAWINGS

The invention will be described in detail in the following description of preferred embodiments with reference to the following figures, wherein:

FIG. 1 is a cross-sectional, schematic diagram of a magnetic tunnel junction cell known in the prior art;

DETAILED DESCRIPTION OF PREFERRED EMBODIMENTS

An MTJ cell has an associated variable resistance which can be used to indicate a logic state. The resistance of an MTJ cell is low when the orientation of the magnetization in a first and second ferromagnetic layer are parallel. The resistance is high when the orientation of the magnetization is anti-parallel. These two resistance states can be written into the cell by applying orthogonal currents through conductors proximate to the cell in a first direction and second direction, respectively.

Figure 2A:
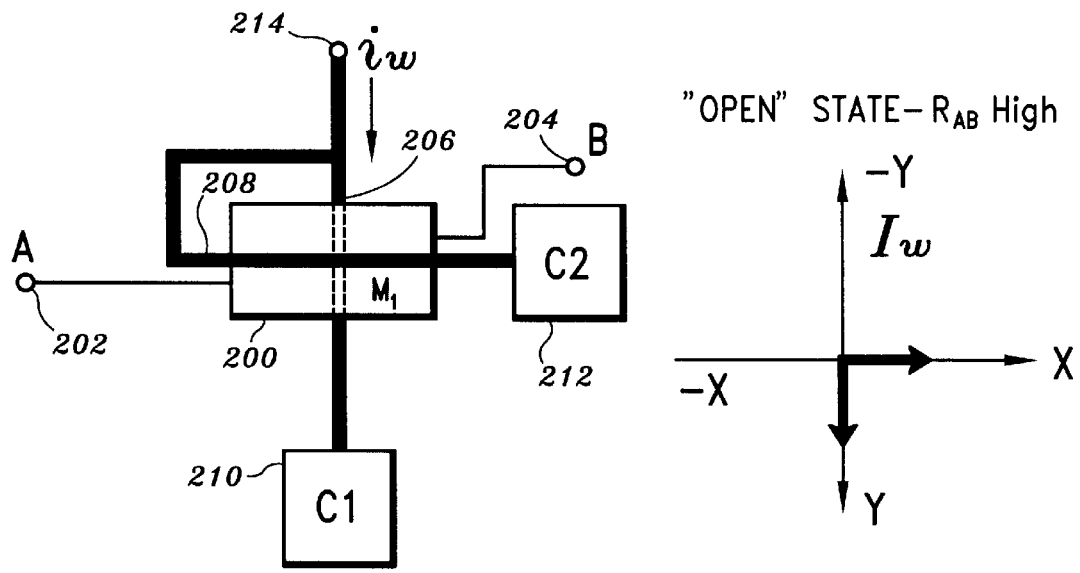
FIG. 2A is a top-view schematic diagram illustrating a first state being written into a MTJ cell, in accordance with the present invention.
Figure 2B:
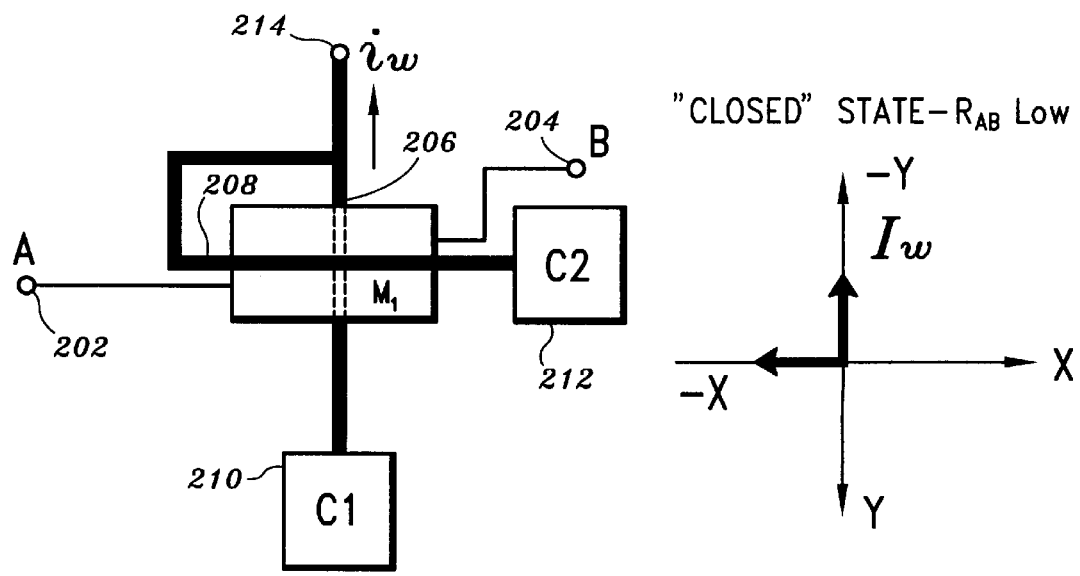
FIG. 2B is a top view schematic diagram illustrating a second state being written into a MTJ cell, in accordance with the present invention.

FIGS. 2A and 2B illustrate a top view of an MTJ cell in accordance with the present invention. The MTJ cell includes an MTJ element 200 formed as a layered structure having a first ferromagnetic (FM) layer a second FM layer and an insulating layer interposed between the ferromagnetic layers. A first electrical terminal 202 is coupled to the first FM layer and a second electrical terminal 204 is coupled to the second FM layer, preferably by forming conductive traces on a conventional metallic layer in contact with the FM layers. The resistance of the MTJ cell is measurable across the first and second electrical terminals 202, 204. The MTJ cell also includes a first conductor segment 206 which runs beneath the MTJ element 200 along a first direction (Y-axis). A second conductor segment 208 runs above the MTJ element 200 along a second direction (X-axis) which is orthogonal to the first direction. The first conductor segment 206 is terminated in first capacitive structure 210 and the second conductor segment 208 is terminated in a second capacitive structure 212. The capacitive structures 210, 212 can be formed in any manner known in the art, including the use of a gate terminal of a field effect transistor. The first and second conductor segments are connected to form a common input terminal 214 for applying a write signal.

Referring to FIG. 2A, when a voltage potential is applied to input terminal 214, a current flows into capacitor structures 210, 212 thereby establishing orthogonal currents in the first segment 206 (in a +Y direction) and second segment 208 (in a +X direction). These currents flow until the capacitive structures 210, 212 are charged. The orthogonal current flowing proximate to the MTJ element 200 establishes a magnetic polarization of the layered structure in an anti-parallel configuration which results in a high resistance between terminals 202, 204. Currents in the range of 1.0–10 ma are generally sufficient to induce a magnetic state change.

When capacitors 210, 212 are charged, a current of opposite orthogonal directions can be induced in segments 206, 208 by grounding input terminal 214, as illustrated in FIG. 2B. Current flow in the −X, −Y directions polarize the MTJ element 200 with the magnetization of the layered structure in a parallel arrangement, thereby resulting in a low resistance across terminals 202, 204. By terminating the conductor segments with charge storing capacitive structures, a bidirectional current can be established using a monopolar write voltage signal and a single port input terminal to the cell.

Figure 2C:
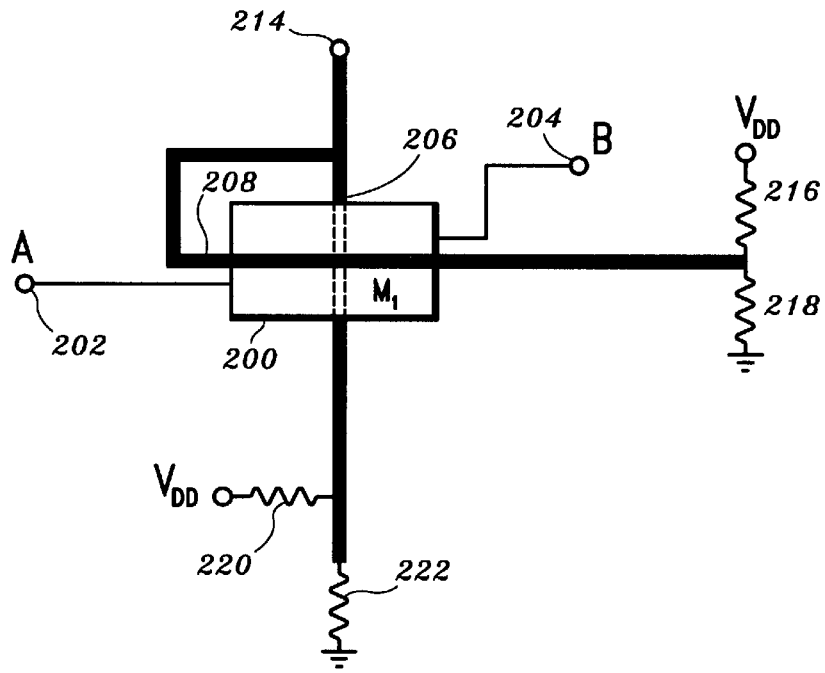
FIG. 2C is a top view schematic diagram of an MTJ cell of the present invention employing voltage dividers for establishing a bi-directional current.

Capacitors 210, 212 terminating the write conductors of the MTJ cell provide a convenient method of establishing a bidirectional current proximate the cell which is required to write the two states into the cell. However, other methods of establishing a bidirectional current may also be employed. For example, the write conductors may be terminated by a voltage divider circuit which maintains a voltage around a voltage mid point. The voltage dividers can be formed with transistors or resistive elements 216, 218 and 220, 222, as shown in FIG. 2C. When the write conductor is in a high impedance state, no current flows. However when the write conductor is brought to a full voltage potential, current flows into the voltage divider in a first direction and when the write conductor is brought to a ground potential current flows from the voltage divider in a second direction.

Figure 3:
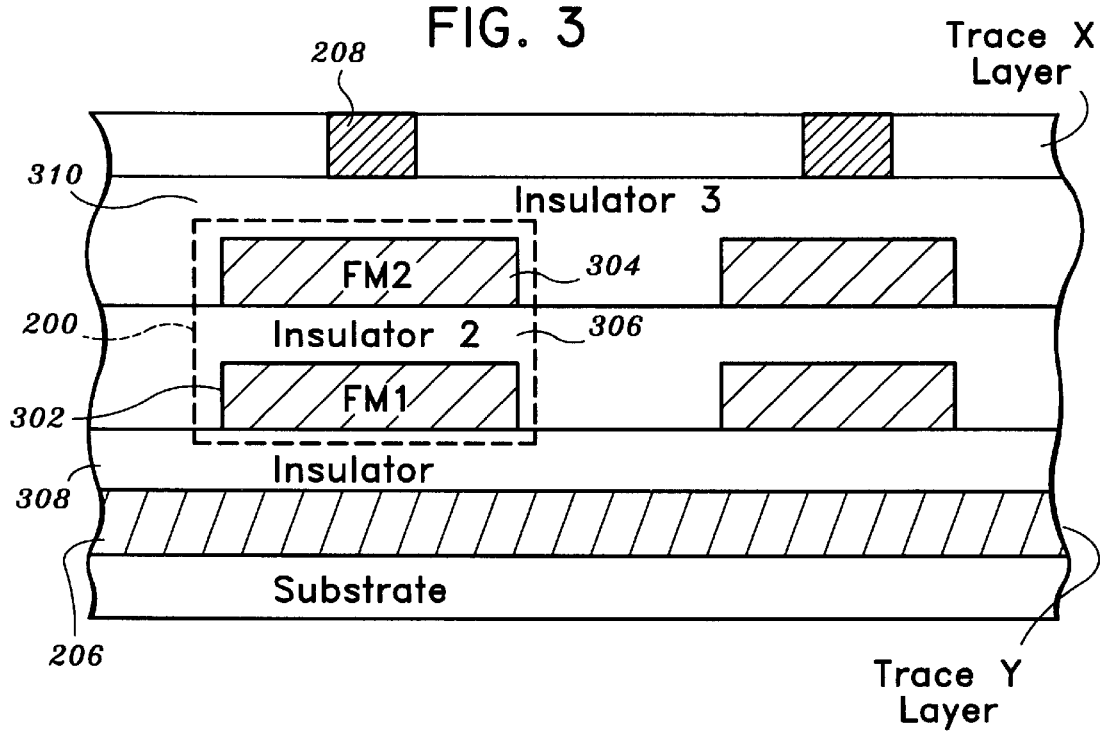
FIG. 3 is a cross-sectional schematic diagram of an MTJ cell formed in accordance with the present invention.

FIG. 3 is a cross-sectional elevation view further illustrating the layer structure of MTJ element 200 and the orientation of conductor segments 206, 208. The MTJ element 200 includes a first ferromagnetic (FM) layer 302, a second ferromagnetic (FM) layer 304 and an insulating layer 306 interposed between the FM layers. The first conductor segment 206 is arranged beneath the first FM layer 302 with an electrical insulating layer 308 interposed between the FM layer 302 and the conductor segment 206. Similarly, an insulating layer 310 separates the second conductor segment 208 from the second FM layer 304. In this way, applied currents in conductor segments 206, 208 establish magnetic fields proximate to the layered structure but do not flow through the MTJ element 200.

Preferably, the first FM layer 302 and second FM layer 304 are formed using half-metallic ferromagnetic materials which exhibit near complete spin polarization. As spin polarization approaches 100%, the MTJ element 200 operates in a manner similar to an ideal switch having an off resistance which is extremely high. This resistance is on the order of 100–10,000 K$\Omega \cdot \mu^2$ (Kilohms·micron squared). Known half-metallic ferromagnetic materials include $CrO_2$, $Fe_3O_4$, manganites taking the form of $La_{1-x}D_xMnO_3$, where D is an alkaline earth element and Heusler alloys of the form $X_2MnY$, where X is one of Co, Ni, Cu, Pd, etc. and Y is one Al, Sn, In, Sb, etc. It is also anticipated that other half-metallic ferromagnetic materials will become available in the future and will exhibit acceptable properties for use in the present invention.

Preferably, the half-metallic ferromagnetic layers are formed with a thickness in the range of 1–100 nanometers. The insulating layer which is interposed between the half-metallic ferromagnetic layers can be a material such as $Al_2O_3$, $TiO_2$, MgO, $SiO_2$, AlN and the like, having a thickness in the range of about 0.5–10 nm.

Figure 4:
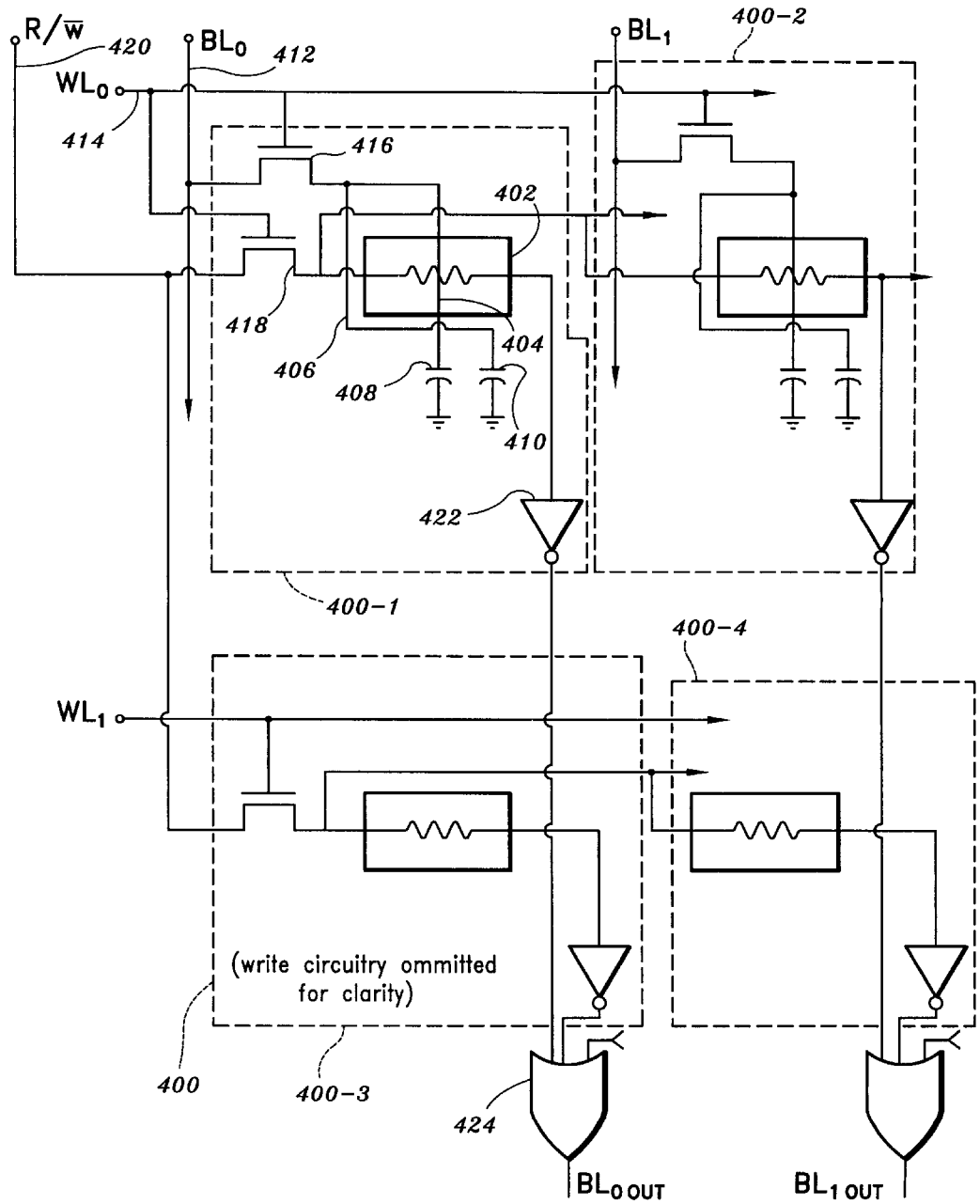
FIG. 4 is a schematic diagram partially illustrating an MRAM array formed in accordance with the present invention.

FIG. 4 illustrates a portion of an MRAM array formed in accordance with the present invention. The portion of the MRAM array illustrated includes four memory cells 400-1, 400-2, 400-3, 400-4. However, it is well understood in the art that useful memory devices are formed with far more cells (on the order of thousands and millions of cells) and that this limited portion merely illustrates the operating principle of the present invention. Each cell 400 includes an MTJ element 402, orthogonal write conductors 404, 406 and capacitors 408, 410 as discussed in connection with FIGS. 2A, 2B and 3. The cells 400 are located in a matrix and correspond to a crossing point of a vertical running bit line 412 and a horizontal running word line 414. For each cell 400, there is a first transistor 416 having a gate terminal coupled to the word line 414 and a drain terminal coupled to the orthogonal write conductors of the MTJ element 402. (It is noted that cells 400-3 and 400-4 are shown without transistor 416 and associated write conductors for the sake of clarity and that such components are included in these cells as well).

To write a first resistance state to a cell 400, a voltage signal is applied to the corresponding bit line 412 and word line 414, thereby allowing a current to flow through transistor 416 and into capacitors 408, 410 (or other circuit elements which provide for bidirectional current flow). This current polarizes the MTJ element 402 in a manner discussed in connection with FIG. 2A. To write a second resistance state into the cell 400, a ground level voltage potential is applied to the bit line 412 while a positive voltage is applied to the corresponding word line 414 of the selected cell 400. This biases transistor 406 such that the charge stored in capacitors 408, 410 is discharged into the bit line 412, thereby creating the required reverse current flow to polarize the MTJ element 402 in the low resistance state, as discussed in connection with FIG. 2B. To ensure that the capacitors 408, 410 include sufficient charge to effect the required current flow, capacitors 408, 410 may be charged in a first portion of a write cycle then discharged to create the second resistance state.

Figure 4A:
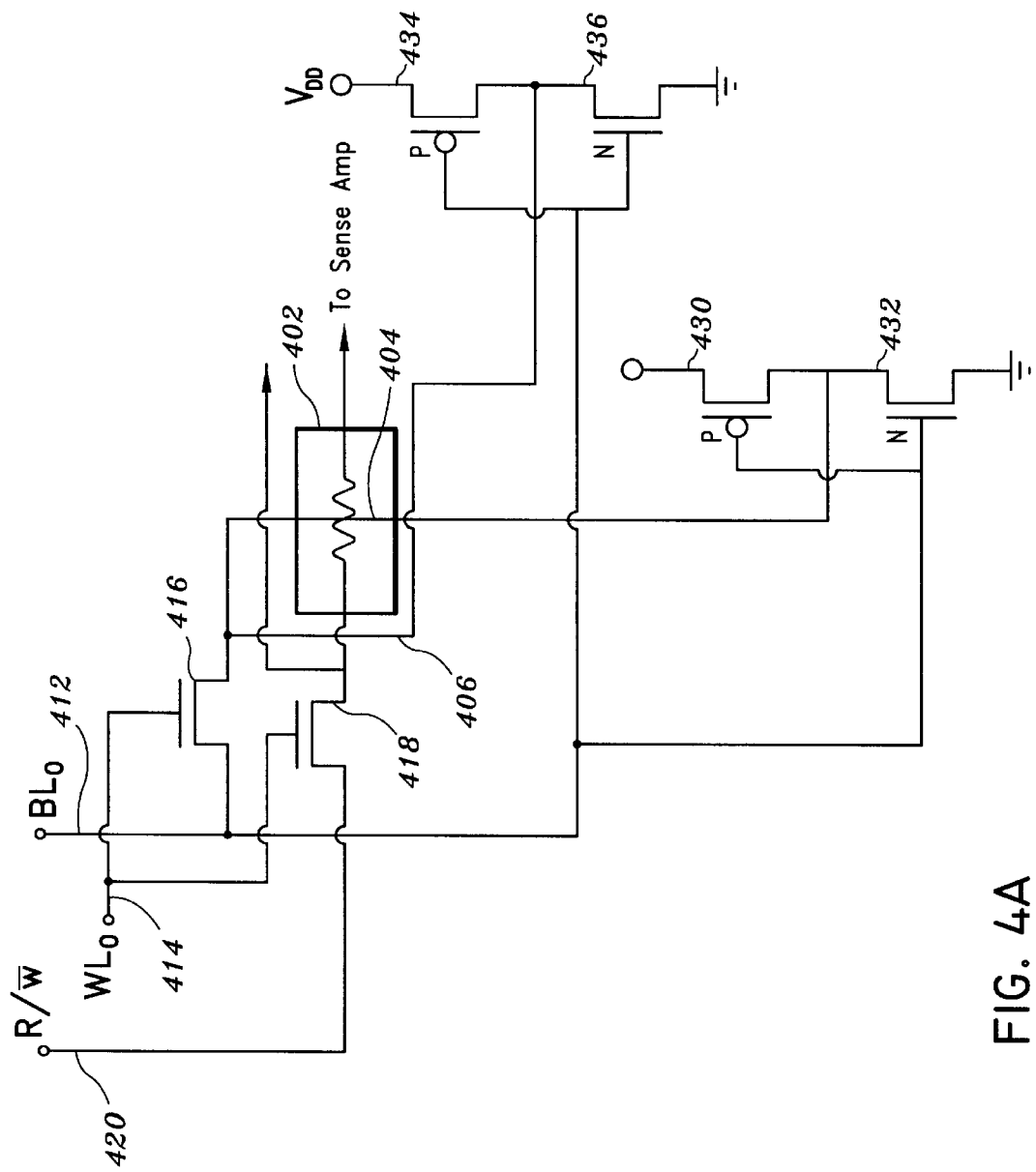
FIG. 4A illustrates a transistor circuit which can be employed for terminating write conductors of an MRAM cell of the present invention.

Capacitors 408, 410 which terminate the write conducts of the MRAM cells can be replaced with other circuit embodiments which enable bidirectional current flow. FIG. 4A illustrates a transistor circuit used to terminate the write conductors for this purpose. in place of capacitor 408, the Y running write conductor segment is terminated by a first transistor 430 and a second transistor 432. Transistors 430, 432 are complementary devices which are connected in series between a voltage source, Vdd, and a ground potential. The gates of transistors 430, 432 are connected together and to the bit line of the corresponding cell 402. The source of transistor 430, which is a P-type device is connected to the drain of transistor 432, which is an N-type device and to the Y running write conductor 404. The X directed write conductor segment 406 is similarly terminated by complimentary transistor pair 434, 436. When both the bit line 412 and word line 414 are high, transistors 432 and 436 are turned on and current flows through transistor 432 in a −Y to +Y direction and also through transistor 436 in a −X to +X direction. However, when bit line 412 goes low while word line 414 is high, transistors 432, 436 are turned off while P-type transistors 430, 434 are turned on. Current now flows through transistor 430 in a +Y to −Y direction and also through transistor 434 in a +X to −X direction. In this way, a "1" or a "0" can be written into the cell 402.

The MRAM array also includes read circuitry in order to ascertain the resistance state of the cells 400. The read circuitry preferably includes a second transistor 418 having a gate terminal coupled to a corresponding word line 414, a drain terminal coupled to a read enable line 420 and a source terminal coupled to the first terminal of each MTJ element 402 in the word line row. The read enable signal conserves power in the MRAM as a current is only applied to the cells during a read operation. The second terminal of each MTJ element is coupled to a corresponding sense amplifier 422. The output of the sense amplifier 422 for each MTJ element 402 associated with a bit line column is coupled together by a logical OR function. This can be accomplished by wiring the outputs together or by using an OR logic gate 424 associated with each bit line 412.

To read the state of a selected cell 400, the read enable line 420 and corresponding word line 414 are brought to a positive voltage level. The sense amplifier 422 preferably includes a detector which is responsive to the applied voltage and MTJ resistance. The sense amplifier 422 detects a first signal level when the MTJ element is in the low resistance state and indicates a logic level "1" at its output. Similarly, the sense amplifier 422 detects a second signal level when the MTJ element is in the high resistance state and indicates a logic level "0". The output of the sense amplifier 422 is coupled to the bit line OR gate 424 which is coupled to suitable decoding circuitry (not shown).

Figure 5:
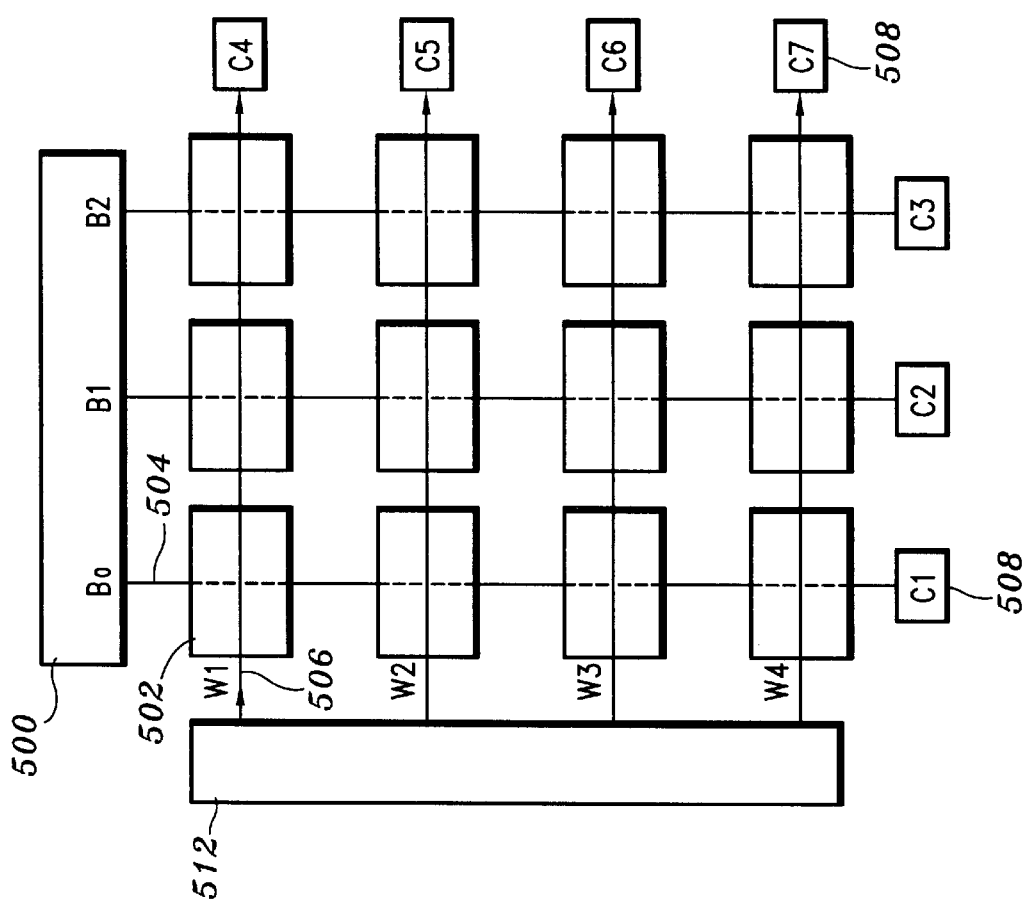
FIG. 5 is a block diagram illustrating an alternate embodiment of an MRAM device formed in accordance with the present invention.

FIG. 5 illustrates an alternate MRAM topology formed in accordance with the present invention. As with FIG. 4, the MRAM of FIG. 5 is formed with a plurality of MTJ cells 502 proximate to the intersection of bit lines 504 and word lines 506. The MTJ elements 502 are located between the vertical running bit lines beneath the elements 502 and the horizontal running word lines above the elements 502. In this way, the word lines 506 and bit lines 504 directly form the orthogonal write conductor segments across each MTJ element 502. Each bit line 504 and each word line 506 is terminated with a circuit element which provides for bidirectional current flow such as capacitive element 508. The MRAM preferably includes a bit line decoder/driver circuit 510 and a word line decoder/driver circuit 512, formed in a manner conventional to memory circuit arrays.

Figure 6A:
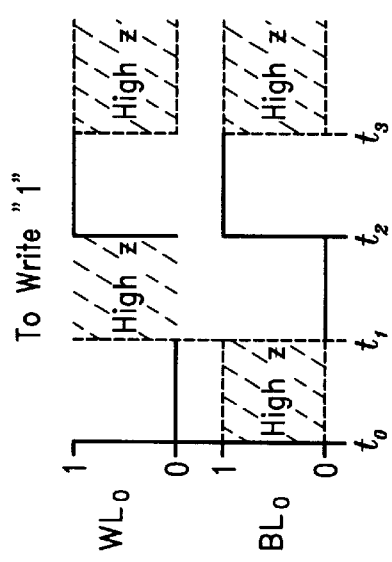
FIGS. 6A and 6B are timing diagrams depicting a write cycle for a logic state "1" and logic state "0", respectively, for the MRAM embodiment depicted in FIG. 5.

To write a resistance state into a corresponding MTJ element 502, current must flow in both the corresponding bit line 504 and word line 506 in order to create a sufficient magnetic field to polarize the element 502. When a current flows in only a word line or a bit line of a cell, that cell is said to be half-selected, and its resistance state is not altered. FIG. 6A is a timing diagram depicting the writing of a first resistance state into a MTJ cell 502-1. At time $t_0$, bit line $B_0$ is held in a high impedance state while write line $W_0$ is brought low to discharge capacitor $C_{W0}$. If capacitor $C_{W0}$ has a charge at time $t_0$, a current will flow in $W_0$ during the period $t_0$ to $t_1$. However, as the bit lines are held in a high impedance state during this period, no current flows in the bit lines and the cells associated with word line $W_0$ are only half selected.

Figure 6B:
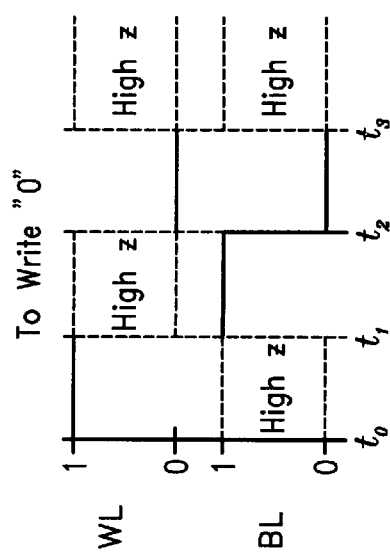

At time $t_1$, the word lines are placed in a high impedance state and the bit line $B_0$ is brought low to discharge capacitor $C_{B0}$. As before, current flowing in the bit line only half-selects the cells along the bit line and does not alter the impedance of those cells. With capacitors $C_{B0}$ and $C_{W0}$ discharged, bit line $B_0$ and word line $W_0$ are brought high, thereby creating the required orthogonal currents proximate to cell 502-1 to polarize the magnetic moments to the first resistance state. The additional cells 502 associated with bit line $B_0$ word line $W_0$ remain unchanged as these cells are only half-selected. FIG. 6B illustrates exemplary timing of a write cycle to change the resistance state of cell 502-1 to the second resistance state. This process is analogous to the process described in connection with FIG. 6A, however the capacitors are initially charged during times $t_0$ and $t_2$ and then discharged during time $t_2$–$t_3$.

In the MRAM of FIG. 5, each bit line 504 and word line 506 can be terminated with a voltage divider structure rather than capacitive structures 508. In this case, when the bit lines and word lines are in a high impedance state, no current flows. However, when the lines are brought high, current flows in a first direction into the voltage divider structure and when the lines are brought low current flows in a second direction, from the voltage divider structure. While this embodiment increases the quiescent current of the MRAM, this can be managed by only enabling the voltage divider structure during a write operation. By using a voltage divider structure, the previously described write cycles of FIGS. 6A and 6B are simplified into a single step process as there is no longer a requirement to insure that the capacitive structures are in the proper initial condition to write to a selected cell. As a further alternative, if the decoder/driver circuits 510, 512 are formed with bidirectional voltage outputs, the bit lines and word lines can be simply connected to a ground potential through a suitable resistance in order to achieve the required bidirectional current flow.

Figure 5A:
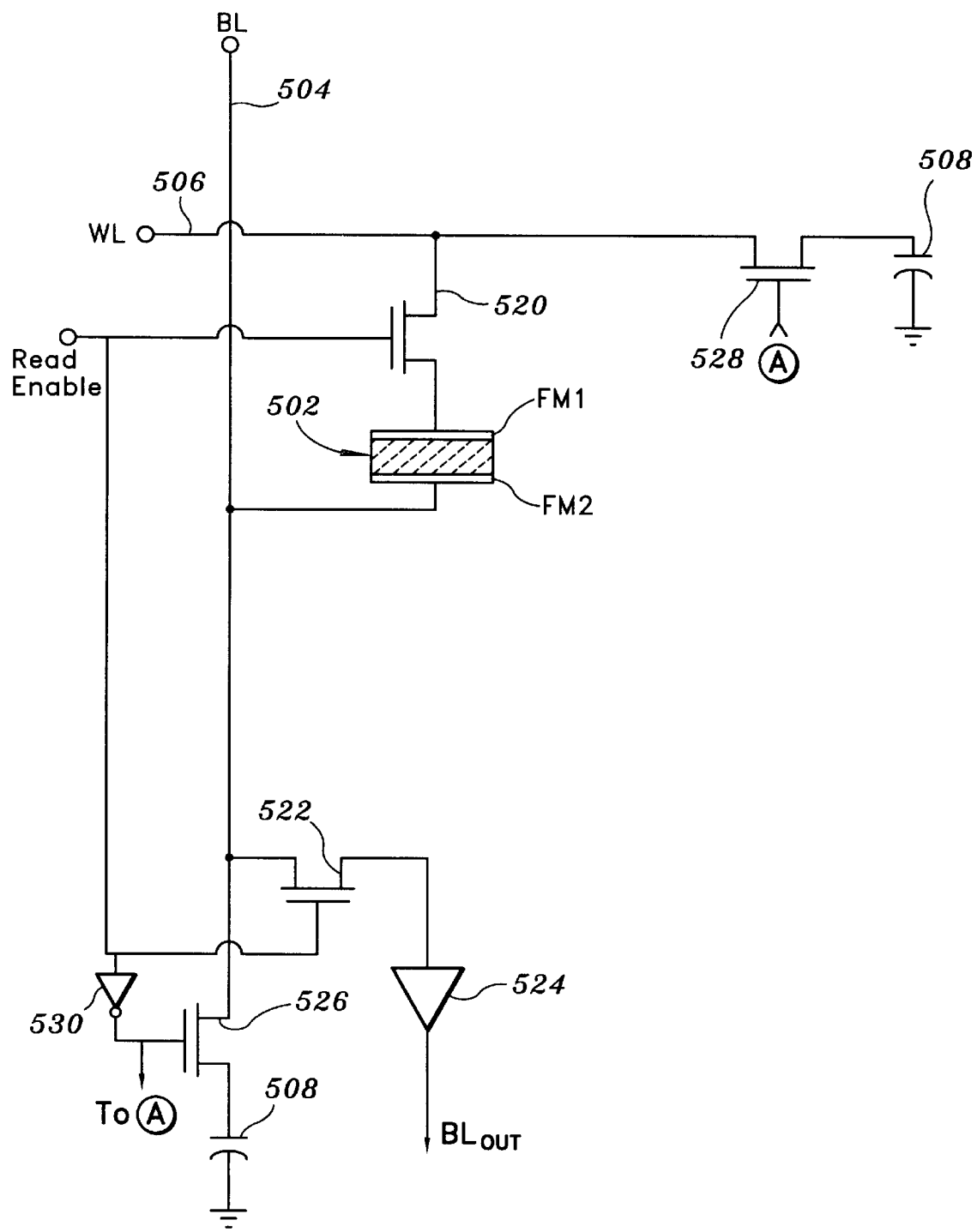
FIG. 5A is a schematic diagram illustrating exemplary read circuitry associated with the MTJ cells in the MRAM of FIG. 5.

FIG. 5A is a schematic diagram illustrating a cell 502 of the MRAM of FIG. 5 further illustrating an exemplary read circuit. A transistor 520 couples the first FM layer of the cell 502 to a corresponding word line 506. The gate of the transistor 520 is coupled to a read enable signal. The second FM layer of cell 502 is connected to a corresponding bit line 504. When the read enable signal is present, a signal presented on word line 506 establishes a read current through transistor 520 and cell 502 into bit line 504. Each bit line includes a second transistor 524 to couple the read current to a sensing amplifier 524 and a second transistor 526 to decouple the capacitive structure 508 from the bit line during a read operation. Similarly, each word line includes a third transistor 528 to decouple the capacitive structure 508 from the word line during a read operation. When transistors 522, 526 and 528 are NMOS devices, the read enable signal applied directly to the gate of transistor 522 and is passed through an inverter 530 and is coupled to the gate of transistors 526, 528. In this way, only a single control line is required. Alternatively, transistor 522 can be a complimentary device to transistors 526, 528 and then be driven by a common enable signal without inverter 530.

While the read circuitry of FIG. 5A is illustrated with transistor 520 coupled to word line 506 and the sensing amplifier coupled through transistor 522 to bit line 504, it will be appreciated that this circuit could be equivalently configured with the bit line and word lines reversed for one another.

Besides being applicable to stand alone memory devices, the MRAM devices of FIGS. 4 and 5 can also be integrated into a microprocessor for use as internal registers and cache memory. To facilitate the integration, flip-chip packaging technology is preferably employed to merge the two fabrication technologies.

Figure 7:
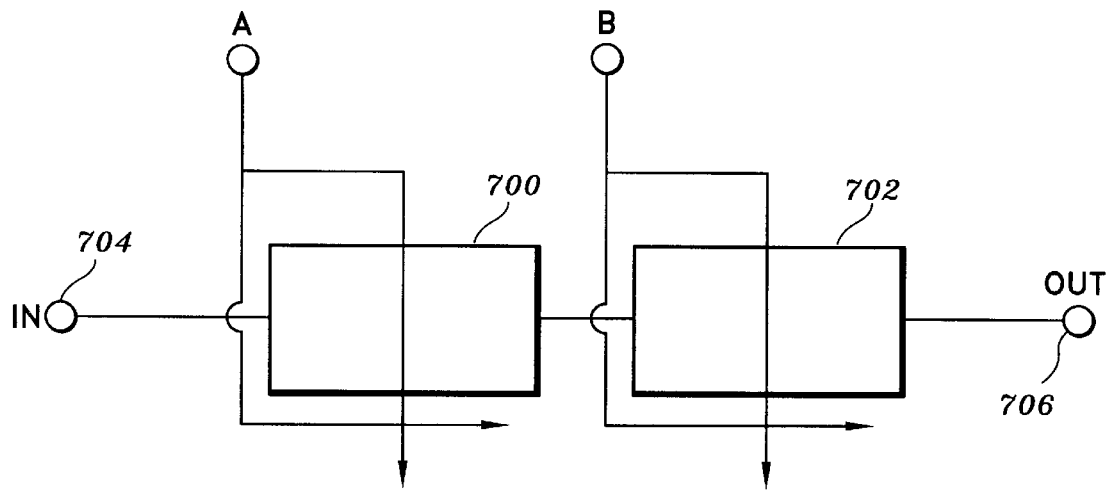
FIG. 7 is a schematic of a logic AND gate formed with MTJ cells in accordance with the present invention.

When an MTJ cell is formed with half-metallic ferromagnetic materials, the improved switching characteristics enable the construction of magnetic logic gates. Referring to FIG. 7, a logic AND gate formed with MTJ cells is depicted. The gate is formed with a first MTJ cell 700 connected in series with a second MTJ cell 702. The write conductors of the first MTJ cell 700 form a first logic input (A) and the write conductors of the second MTJ cell 702 form a second logic input (B). The gate also has an input terminal 704 connected to the first MTJ cell 700 and an output terminal 706 which is coupled to the second MTJ cell 702. When a positive voltage is applied to the input terminal 704, the gate operates in accordance with the truth table of an AND logic gate, shown below:

TABLE 1

| A | B | Out |
|---|---|-----|
| 0 | 0 | 0 |
| 0 | 1 | 0 |
| 1 | 1 | 0 |
| 1 | 1 | 1 |

The output can be inverted by connecting the input to a logic low potential and connecting a pull-up resistance from the output terminal 706 to a positive voltage source.

In this configuration, a logical NAND function is achieved.

Figure 8:
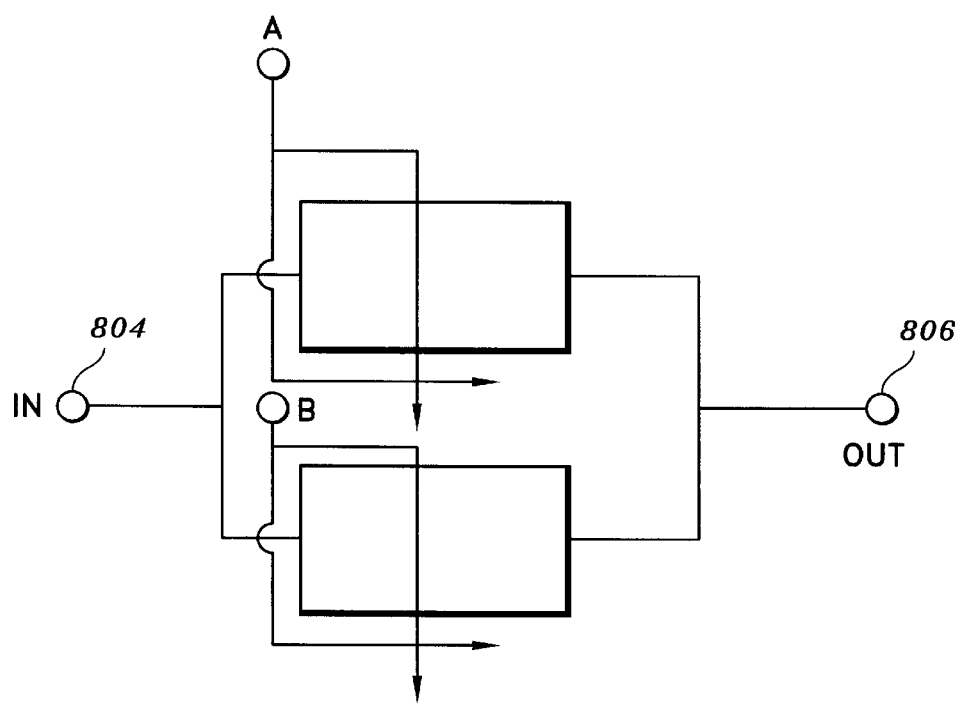
FIG. 8 is a schematic of a logic OR gate formed with MTJ cells in accordance with the present invention.

Similarly, MTJ cells can be configured to form a logic OR/NOR gate, as illustrated in FIG. 8. In this embodiment, a first MTJ cell 800 and second MTJ cell 802 are connected in parallel. When either MTJ cell is magnetized such that the resistance of the cell is low, a signal applied to an input terminal 804 is passed to the output terminal 806.

In both FIG. 7 and FIG. 8, the write conductors of the MTJ cells are arranged such that the cells respond in a like manner to an applied signal at the logic input terminals A,B. In other words, the application of a positive voltage places the cells in the low resistance state while the application of a ground potential places the cells in the high impedance state, in a manner described in connection with FIGS. 2B and 2A, respectively.

Figure 9:
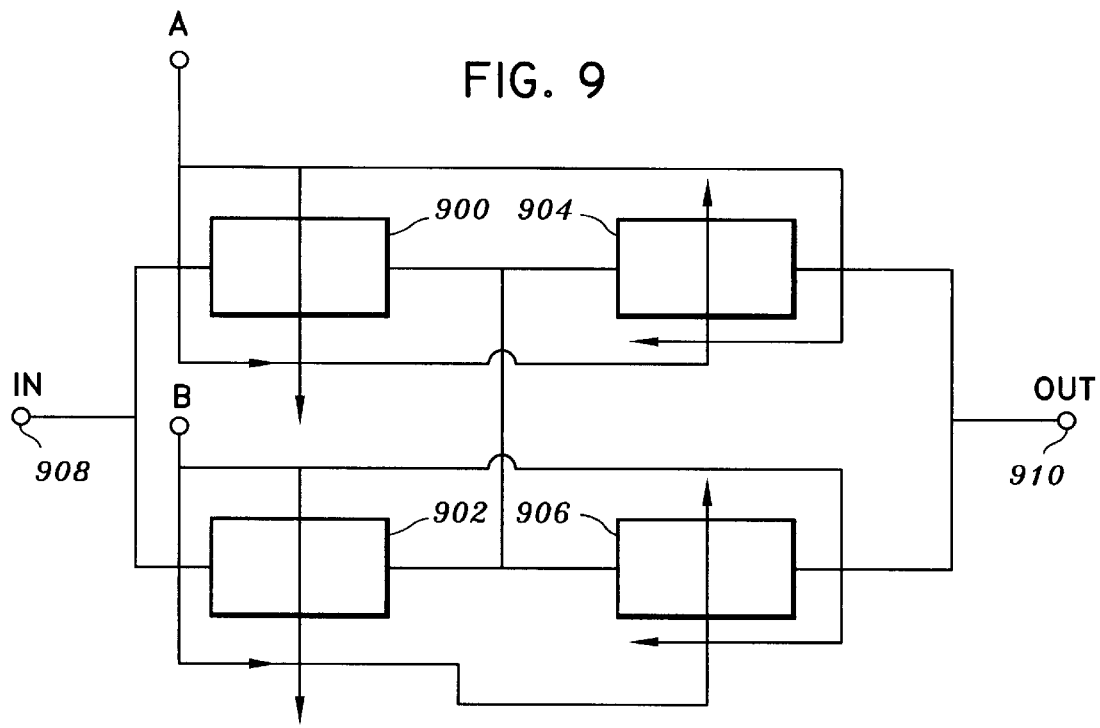
FIG. 9 is a schematic diagram of a logic XOR gate formed with MTJ cells in accordance with the present invention.

FIG. 9 illustrates an embodiment of an exclusive OR (XOR) logic gate formed in accordance with the present invention. The XOR gate is formed with a first pair of MTJ cells 900, 902 which are connected in parallel and a second pair of MTJ cells 904, 906 connected in parallel with each other and in series with the first pair of cells. Cells 900 and 904 are controlled by write conductors which are responsive to a signal applied to logic input terminal A and cells 902, 906 are responsive to a signal applied to logic input terminal B. The write conductors of cells 900 and 902 are arranged such that a high input signal endures a current in a first direction which (+x, +y) magnetizes the cells in the low resistance state. The write conductors in cell 904 and 906 are oppositely directed to those in cells 900, 902 such that a high input signal induces a current in a second direction which (−x, −y)magnetizes cells 904, 906 in the high resistance state. As a result, when a high level signal is applied to terminal A, cell 900 is set in the low resistance state while cell 904 is set in the high resistance state. Similarly, when a high level signal is applied to terminal B, cell 902 is set in the low resistance state while cell 906 is set in the high resistance state. In order to pass a signal from the input terminal 908 to the output terminal 910, one of cells 900 or 902 must be in the low resistance state and one of cells 904 or 906 must also be in the low resistance state, thus establishing an XOR logic function as defined by the truth table below:

TABLE 2

| IN | A | B | OUT |
|----|---|---|-----|
| 1 | 0 | 0 | 0 |
| 1 | 0 | 1 | 1 |

TABLE 2-continued

| IN | A | B | OUT |
|---|---|---|---|
| 1 | 1 | 0 | 1 |
| 1 | 1 | 1 | 0 |

FIGS. 7–9 illustrate exemplary embodiments of logic gates formed with MTJ cells. While each embodiment illustrated represents a two input logic function (A,B), the number of inputs can readily be expanded to any desired number. In addition, a single MTJ cell can be used as a buffer/inverter. As combinational logic functions can be implemented with simple arrangements of MTJ cells, the integration of magnetic memory and associated decoder logic can be formed on the same substrate, using the same manufacturing process, if desired.

Figure 10:
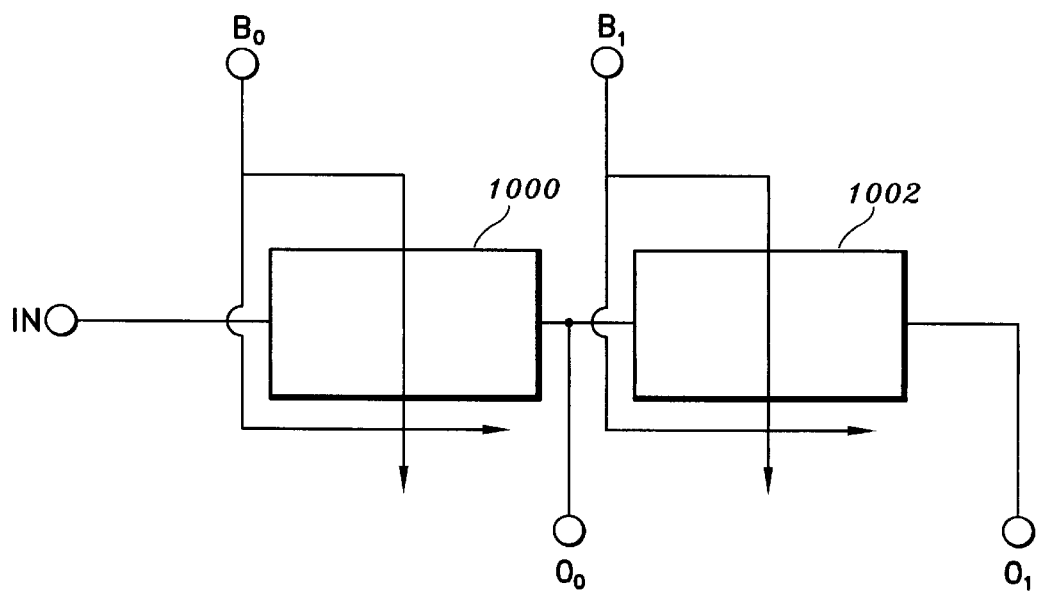
FIG. 10 is a schematic diagram of a magnetic random memory-logic device formed with MTJ cells in accordance with the present invention.

FIG. 10 is a schematic diagram illustrating a portion combinational memory and logic array formed in accordance with the present invention. The array includes MTJ cells 1000, 1002 connected in series in a manner similar to that described in connection with FIG. 7. The simplified array includes an input terminal, a first bit line terminal B0 coupled to the write conductors of cell 1000, a second bit line terminal B1 coupled to the write conductors of cell 1002, a first output terminal $O_0$ coupled to the junction of cells 1000, 1002 and a second output terminal $O_1$ coupled to the output of cell 1002. In this configuration, the first output is related to the applied data and the current state of cell 1000. The second output terminal $O_1$ is related to the applied data, the state of cell 1000 and the state of cell 1002. While an AND configuration is illustrated, various logic-memory combinations can be formed. In addition, the array can be extended to large numbers of cells in combination.

Having described preferred embodiments of the present invention, it is noted that modifications and variations can be made by persons skilled in the art in light of the above teachings. It is therefore understood that changes may be made in particular embodiments of the invention disclosed which are within the scope and spirit of the invention as outlined by the appended claims.

What is claimed is:

1. A magnetic tunneling junction cell comprising:
    a first ferromagnetic layer;
    a second ferromagnetic layer;
    an insulating layer interposed between said first and second ferromagnetic layers;
    a write conductor, said write conductor including a first conductor segment aligned in a first direction and proximate said first ferromagnetic layer and a second conductor segment aligned in a second direction, substantially orthogonal to the first direction and proximate said second ferromagnetic layer; and
    a circuit structure terminating said first and second conductor segments, said circuit structure enabling bidirectional current flow in said conductor signals in the presence of a write signal.

2. The magnetic tunneling junction cell as defined by claim 1, wherein said first and second ferromagnetic layers are formed with half-metallic ferromagnetic material.

3. The magnetic tunneling junction cell is defined by claim 2, wherein said circuit structure is a capacitive element.

4. The magnetic tunneling junction cell as defined by claim 2, wherein said circuit structure is a voltage divider circuit, and wherein said write signal is a tri-state signal.

5. The magnetic tunneling junction cell as defined by claim 2, wherein said circuit structure comprises:
    a first transistor coupled to a positive voltage potential; and
    a second transistor, said second transistor being coupled to said first transistor and to a circuit ground potential, said first and second transistors being complementary devices controlled by a common signal, whereby when said signal is in a first state current flows from said positive voltage potential, through said first transistor into said conductor segment in a first direction and when said signal is in a second state current flows from said conductor segment, through said second transistor to the circuit ground potential in a second direction.

6. The magnetic tunneling junction cell as defined by claim 2, wherein said half-metallic material is selected from the group including: $CrO_2$, $Fe_3O_4$, manganites taking the form of $La_{1-x}D_xMnO_3$ where D is an alkaline earth element, and Heusler alloys of the form $X_2MnY$, where X is one of Co, Ni, Cu, and Pd and Y is one Al, Sn, In, and Sb.

7. The magnetic random access memory device having a plurality of bit lines and a plurality of word lines, the bit lines and word lines running in a substantially orthogonal fashion forming a plurality of intersection points, the memory device comprising:
    a plurality of magnetic tunnel junction cells, said cells being associated with the plurality of intersection points, the cells comprising:
        a first ferromagnetic layer;
        a second ferromagnetic layer;
        an insulating layer interposed between said first and second ferromagnetic layers;
        a write conductor, said write conductor including a first conductor segment aligned in a first direction and proximate said first ferromagnetic layer and a second conductor segment aligned in a second direction, substantially orthogonal to the first direction, and proximate said second ferromagnetic layer;
        a circuit structure terminating said first and second conductor segments, said circuit structure enabling bidirectional current flow in said conductor segments in response to a received write signal;
        a first transistor coupling said write conductor to a corresponding bit line and word line;
        a second transistor coupling said corresponding word line to said first ferromagnetic layer; and
        a sense amplifier, said sense amplifier being interposed between said second ferromagnetic layer and a corresponding output bit line.

8. The magnetic memory device as defined by claim 7, wherein said first and second ferromagnetic layers are formed with half-metallic ferromagnetic material.

9. The magnetic memory device as defined by claim 8, wherein said half-metallic material is selected from the group including: $CrO_2$, $Fe_3O_4$, manganites taking the form of $La_{1-x}D_xMnO_3$ where D is an alkaline earth element, and Heusler alloys of the form $X_2MnY$, where X is one of Co, Ni, Cu, and Pd and Y is one Al, Sn, In, and Sb.

10. The magnetic memory device as defined by claim 8, wherein said circuit structure is a capacitive element.

11. The magnetic memory device as defined by claim 8, wherein said circuit structure is a voltage divider circuit, and wherein said write signal is a tri-state signal.

12. The magnetic memory device as defined by claim 8, wherein said circuit structure comprises:
    a first transistor coupled to a positive voltage potential; and a second transistor, said second transistor being coupled to said first transistor and to a circuit ground potential, said first and second transistors being complementary devices controlled by a common signal, whereby when said signal is in a first state current flows from said positive voltage potential, through said first transistor into said conductor segment in a first direction and when said signal is in a second state current flows from said conductor segment, through said second transistor to the circuit ground potential in a second direction.

13. A magnetic random access memory device comprising:
a plurality of tri-state bit lines, said bit lines being substantially parallel to one another and residing on a first plane;
a plurality of tri-state word lines, said word lines being substantially parallel to one another and residing on a second plane, said word lines running in a substantially orthogonal fashion to said bit lines forming a plurality of intersection points;
a plurality of circuit structures, said circuit structures terminating each of said word lines and said bit lines and enabling bidirectional current flow in response to a received write signal;
a plurality of magnetic tunnel junction cells, said cells being associated with said plurality of intersection points and interposed between said first plane and said second plane, the cells comprising:
a first ferromagnetic layer;
a second ferromagnetic layer; and
an insulating layer interposed between said first and second ferromagnetic layers; and
means for coupling said cell to said corresponding word line and bit line during a read cycle, whereby the state of said cell is written by passing a current in said corresponding bit line and word line and said cell is read by enabling said coupling means to detect a read signal from said cell.

14. The magnetic tunneling junction cell as defined by claim 13, wherein said first and second ferromagnetic layers are formed with half-metallic ferromagnetic material.

15. The magnetic tunneling junction cell as defined by claim 14, wherein said half-metallic material is selected from the group including: $CrO_2$, $Fe_3O_4$, manganites taking the form of $La_{1-x}D_xMnO_3$ where D is an alkaline earth element, and Heusler alloys of the form $X_2MnY$, where X is one of Co, Ni, Cu, and Pd and Y is one Al, Sn, In, and Sb.

16. The magnetic memory device as defined by claim 14, wherein said circuit structure is a capacitive element.

17. The magnetic memory device as defined by claim 14, wherein said circuit structure is a voltage divider circuit.

18. The magnetic memory device as defined by claim 14, wherein said circuit structure comprises:
a first transistor coupled to a positive voltage potential; and
a second transistor, said second transistor being coupled to said first transistor and to a circuit ground potential, said first and second transistors being complementary devices controlled by a common signal, whereby when said signal is in a first state current flows from said positive voltage potential, through said first transistor into said conductor segment in a first direction and when said signal is in a second state current flows from said conductor segment, through said second transistor to the circuit ground potential in a second direction.

19. A magnetic logic device comprising:
a first half-metallic magnetic tunneling junction cell having an input terminal, an output terminal and a first write conductor input terminal, said first half-metallic magnetic tunneling junction cell having an ON state and an OFF state which are set in response to a signal applied to said write conductor input terminal, said on state presenting a low resistance between said input and output terminals and said off state presenting a high resistance between said input and output terminals; and
a second half-metallic magnetic tunneling junction cell having an input terminal, an output terminal, and a second write conductor input terminal, said first half-metallic magnetic tunneling junction cell having an ON state and an OFF state which are set in response to a signal applied to said write conductor input terminal, said on state presenting a low resistance between said input and output terminals and said off state presenting a high resistance between said input and output terminals;
said first and second write conductor input terminals forming logic input terminals, said input and output terminals being coupled to implement a logic function between a logic device output terminal and said logic input terminals.

20. The magnetic logic device as defined by claim 19, wherein said input terminals are connected together and are further connected to a positive voltage potential and said output terminals are connected together forming said logic device output terminal, whereby said logic function is an OR function.

21. The magnetic logic device as defined by claim 19, wherein said input terminal of said first cell is coupled to a positive voltage potential, said output terminal of said first cell is coupled to said input terminal of said second cell and said output terminal of said second cell is said logic device output terminal, whereby said logic function is an AND function.

22. The magnetic logic device as defined by claim 19, further comprising a pull up resistance coupled from a positive voltage potential to said logic device output terminal, wherein said input terminals are connected together and are further connected to a ground voltage potential, said output terminals are connected together forming said logic device output terminal, whereby said logic function is an NOR function.

23. The magnetic logic device as defined by claim 19, further comprising a pull up resistance coupled from a positive voltage potential to said logic device output terminal, wherein said input terminal of said first cell is coupled to a ground voltage potential, said output terminal of said first cell is coupled to said input terminal of said second cell and said output terminal of said second cell is said logic device output terminal, whereby said logic function is an NAND function.

24. The magnetic logic device as defined by claim 19, further comprising:
a third half-metallic magnetic tunneling junction cell having an input terminal, an output terminal and a third write conductor input terminal, said first half-metallic magnetic tunneling junction cell having an ON state and an OFF state which are set in response to a signal applied to said write conductor input terminal with respect to said first and second cells , said on state presenting a low resistance between said input and output terminals and said off state presenting a high resistance between said input and output terminals;

a fourth half-metallic magnetic tunneling junction cell having an input terminal, an output terminal, and a fourth write conductor input terminal, said first half-metallic magnetic tunneling junction cell having an ON state and an OFF state which are set in response to a signal applied to said write conductor input terminal, said on state presenting a low resistance between said input and output terminals and said off state presenting a high resistance between said input and output terminals;

said input terminals of said first and second cells being coupled together to form a device input terminal;

said output terminals of said first and second cells being coupled together and to said input terminals of said third and fourth cells;

said output terminals of said third and fourth cells being coupled together and forming said logic output terminal;

said write conductor of said first cell and said write conductor of said third cell being coupled together forming a first logic input terminal, said write conductor of said first cell being arranged in an opposite orientation with respect to said write conductor of said third cell, whereby an applied signal to said first logic terminal sets the state of said first and third cell in opposite states; and said write conductor of said second cell and said write conductor of said fourth cell being coupled together forming a second logic input terminal, said write conductor of said second cell being arranged in an opposite orientation with respect to said write conductor of said fourth cell, whereby an applied signal to said second logic terminal sets the state of said first and third cell in opposite states.

25. The magnetic logic device as defined by claim 24, wherein said device input terminal is coupled to a positive voltage potential whereby said logic function is an Exclusive OR function.

26. The magnetic logic device as defined by claim 24, further comprising a pull up resistance between a positive voltage potential and said logic output terminal and wherein said device input terminal is coupled to a ground voltage potential, whereby said logic function is an Exclusive NOR function.

27. A computer integrated circuit having non-volatile magnetic random access memory, including a plurality of bit lines and a plurality of word lines, the bit lines and word lines running in a substantially orthogonal fashion forming a plurality of intersection points, the magnetic memory comprising:

a plurality of magnetic tunnel junction cells, said cells being associated with the plurality of intersection points, the cells comprising:
a first ferromagnetic layer;
a second ferromagnetic layer;
an insulating layer interposed between said first and second ferromagnetic layers;
a write conductor, said write conductor including a first conductor segment aligned in a first direction and proximate said first ferromagnetic layer and a second conductor segment aligned in a second direction, substantially orthogonal to the first direction, and proximate said second ferromagnetic layer;
a circuit structure terminating said first and second conductor segments, said circuit structure enabling bidirectional current flow in said conductor segments in response to a received write signal;

a first transistor coupling said write conductor to a corresponding bit line and word line;
a second transistor coupling said corresponding word line to said first ferromagnetic layer; and
a sense amplifier, said sense amplifier being interposed between said second ferromagnetic layer and a corresponding output bit line.

28. The computer integrated circuit as defined by claim 27, wherein said first and second ferromagnetic layers are formed with half-metallic ferromagnetic material.

29. The computer integrated circuit as defined by claim 28, wherein said half-metallic material is selected from the group including: $CrO_2$, $Fe_3O_4$, manganites taking the form of $La_{1-x}D_xMnO_3$ where D is an alkaline earth element, and Heusler alloys of the form $X_2MnY$, where X is one of Co, Ni, Cu, and Pd and Y is one Al, Sn, In, and Sb.

30. The computer integrated circuit as defined by claim 28, wherein said circuit structure is a capacitive element.

31. The computer integrated circuit as defined by claim 28, wherein said circuit structure is a voltage divider circuit, and wherein said write signal is a tri-state signal.

32. The computer integrated circuit as defined by claim 28, wherein said magnetic random access memory further comprises:

a plurality of tri-state bit lines, said bit lines being substantially parallel to one another and residing on a first plane;

a plurality of tri-state word lines, said word lines being substantially parallel to one another and residing on a second plane, said word lines running in a substantially orthogonal fashion to said bit lines forming a plurality of intersection points;

a plurality of circuit structures, said circuit structures terminating each of said word lines and said bit lines and enabling bidirectional current flow in response to a received write signal;

a plurality of magnetic tunnel junction cells, said cells being associated with said plurality of intersection points and interposed between said first plane and said second plane, the cells comprising:
a first ferromagnetic layer;
a second ferromagnetic layer; and
an insulating layer interposed between said first and second ferromagnetic layers; and
means for coupling said cell to said corresponding word line and bit line during a read cycle, whereby the state of said cell is written by passing a current in said corresponding bit line and word line and said cell is read by enabling said coupling means to detect a read signal from said cell.

33. The computer integrated circuit as defined by claim 32, wherein said first and second ferromagnetic layers are formed with half-metallic ferromagnetic material.

34. The computer integrated circuit as defined by claim 33, wherein said half-metallic material is selected from the group including: $CrO_2$, $Fe_3O_4$, manganites taking the form of $La_{1-x}D_xMnO_3$ where D is an alkaline earth element, and Heusler alloys of the form $X_2MnY$, where X is one of Co, Ni, Cu, and Pd and Y is one Al, Sn, In, and Sb.

35. The computer integrated circuit as defined by claim 32, wherein said circuit structure is a capacitive element.

36. A computer integrated circuit as defined by claim 32, wherein said circuit structure is a voltage divider circuit.

37. The computer integrated circuit as defined by claim 32, wherein said circuit structure comprises:

a first transistor coupled to a positive voltage potential; and a second transistor, said second transistor being coupled to said first transistor and to a circuit ground potential, said first and second transistors being complementary devices controlled by a common signal, whereby when said signal is in a first state current flows from said positive voltage potential, through said first transistor into said conductor segment in a first direction and when said signal is in a second state current flows from said conductor segment, through said second transistor to the circuit ground potential in a second direction.

38. A magnetic random access memory-logic array having a plurality of bit lines and a plurality of word lines, the bit lines and word lines running in a substantially orthogonal fashion forming a plurality of intersection points, the memory-logic array comprising:
   a plurality of magnetic tunnel junction cells, said cells being associated with the plurality of intersection points, the cells comprising:
      a first ferromagnetic layer;
      a second ferromagnetic layer;
      an insulating layer interposed between said first and second ferromagnetic layers;
      a write conductor, said write conductor including a first conductor segment aligned in a first direction and proximate said first ferromagnetic layer and a second conductor segment aligned in a second direction, substantially orthogonal to the first direction, and proximate said second ferromagnetic layer;
   a circuit structure terminating said first and second conductor segments, said circuit structure enabling bidirectional current flow in said conductor segments in response to a received write signal to set an associated cell into one of a low resistance state and a high resistance state; and
   at least a portion of said plurality of magnetic tunnel junction cells being interconnected to implement a combinational logic function, said array having at least one output signal related to the state of said at least a portion of cells and said combinational logic function.

39. The magnetic random access memory-logic array as defined by claim 38, wherein said first and second ferromagnetic layers are formed with half-metallic ferromagnetic material.

40. The magnetic random access memory-logic array as defined by claim 39, wherein said half-metallic material is selected from the group including: $CrO_2$, $Fe_3O_4$, manganites taking the form of $La_{1-x}D_xMnO_3$, where D is an alkaline earth element, and Heusler alloys of the form $X_2MnY$, where X is one of Co, Ni, Cu, and Pd and Y is one Al, Sn, In, and Sb.

41. The magnetic random access memory-logic array as defined by claim 39, wherein said circuit structure is a capacitive element.

42. The magnetic random access memory-logic array as defined by claim 39, wherein said circuit structure is a voltage divider circuit, and wherein said write signal is a tri-state signal.

43. A magnetic memory device as defined by claim 39, wherein said circuit structure comprises:
   a first transistor coupled to a positive voltage potential; and
   a second transistor, said second transistor being coupled to said first transistor and to a circuit ground potential, said first and second transistors being complementary devices controlled by a common signal, whereby when said signal is in a first state current flows from said positive voltage potential, through said first transistor into said conductor segment in a first direction and when said signal is in a second state current flows from said conductor segment, through said second transistor to the circuit ground potential in a second direction.

* * * * *